(12) United States Patent
Iwayama et al.

(10) Patent No.: US 8,816,320 B2
(45) Date of Patent: Aug. 26, 2014

(54) GAN-CONTAINING SEMICONDUCTOR LIGHT EMITTING DEVICE

(71) Applicant: Stanley Electric Co., Ltd., Tokyo (JP)

(72) Inventors: Sho Iwayama, Yokohama (JP);
Masahiko Moteki, Yokohama (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/743,961

(22) Filed: Jan. 17, 2013

(65) Prior Publication Data

US 2013/0187168 A1 Jul. 25, 2013

(30) Foreign Application Priority Data

Jan. 23, 2012 (JP) ................................. 2012-010809
Jan. 23, 2012 (JP) ................................. 2012-010810

(51) Int. Cl.
*H01L 29/06* (2006.01)
*H01L 33/32* (2010.01)
*H01L 33/06* (2010.01)

(52) U.S. Cl.
CPC ..................................... *H01L 33/32* (2013.01);
*H01L 33/06* (2013.01)
USPC ............ 257/9; 257/14; 257/79; 257/E29.072;
257/E31.033

(58) Field of Classification Search
None
See application file for complete search history.

(56) References Cited

U.S. PATENT DOCUMENTS

| 8,168,986 B2 | 5/2012 | Nishinaka et al. | |
| 2005/0199903 A1* | 9/2005 | Kyono et al. | 257/103 |
| 2009/0256494 A1* | 10/2009 | Nishinaka et al. | 315/291 |

FOREIGN PATENT DOCUMENTS

| JP | 2002-270894 A | 9/2002 |
| JP | 2004-087908 A | 3/2004 |
| JP | 2009-259885 A | 11/2009 |

OTHER PUBLICATIONS

Min-Ho Kim, et al.: "Origin of efficiency droop in GaN-based light emitting diodes": Applied Physics Letters 91 183507(2007) (In English).
Jiuru Xu, et al,: "Reduction in efficiency droop, forward voltage, ideality factor, and wavelength shift in polarization-matched GaInN/GaInN multi-guantum-well light emitting diodes": Applied Physics Letters 94 011113 (2009) (In English).
Hun Jae Chung, et al.: "Improved performance of GaN-based blue light emitting diodes with InGaN/GaN multilayer barriers": Applied Physics Letters 95 241109 (2009) (In English).

* cited by examiner

*Primary Examiner* — Tan N Tran
*Assistant Examiner* — Scott R Wilson
(74) *Attorney, Agent, or Firm* — Holtz Holtz Goodman & Chick PC (57) ABSTRACT

A GaN-containing semiconductor light emitting device includes: an n-type semiconductor layer formed of GaN-containing semiconductor, an active layer formed on the n-type semiconductor layer, formed of GaN-containing semiconductor, and having a multiple quantum well structure including a plurality of barrier layers and well layers stacked alternately, and a p-type semiconductor layer formed on the active layer and formed of GaN-containing semiconductor, wherein: the barrier layers comprise: a first barrier layer disposed nearest to the n-type semiconductor layer among the barrier layers and formed of a GaN/AlGaN layer, and second barrier layers disposed nearer to the p-type semiconductor layer than the first barrier layer and including an InGaN/GaN layer which has a layered structure of a InGaN sublayer and a GaN sublayer; and the well layers are each formed of an InGaN layer having a narrower band gap than that in the InGaN sublayer.

2 Claims, 11 Drawing Sheets

GAN-CONTAINING SEMICONDUCTOR LIGHT EMITTING DEVICE

CROSS REFERENCE TO RELATED APPLICATION

This application is based on and claims priority of Japanese Patent Applications No. 2012-010809 filed on Jan. 23, 2012 and No. 2012-010810 filed on Jan. 23, 2012, the entire contents of which are incorporated herein by reference.

BACKGROUND OF THE INVENTION

A) Field of the Invention

The invention relates to a GaN-containing semiconductor light emitting device.

B) Description of the Related Art

In recent years, demands have been increasing for high current, high output GaN-containing semiconductor light emitting diodes (LEDs) for lighting uses. It is not easy, however, to produce a GaN-containing semiconductor LED with improved light emitting efficiency because, for instance, of the so-called droop phenomenon in which light emitting efficiency decreases with an increasing current density.

References on GaN-containing semiconductor LEDs include Appl. Phys. Lett. 91, 183507 (2007), Appl. Phys. Lett. 94, 011113 (2009), Appl. Phys. Lett. 95, 241109 (2009), Japanese Unexamined Patent Publication (Kokai) No. 2004-87908, Japanese Unexamined Patent Publication (Kokai) No. 2002-270894, and Japanese Unexamined Patent Publication (Kokai) No. 2009-259885.

SUMMARY

According to one aspect of the present invention, there is provided a GaN-containing semiconductor light emitting device including: an n-type semiconductor layer formed of GaN-containing semiconductor having an n-type electric conductivity, an active layer formed on the n-type semiconductor layer, formed of GaN-containing semiconductor, and having a multiple quantum well structure including a plurality of barrier layers and well layers stacked alternately, and a p-type semiconductor layer formed on the active layer and formed of GaN-containing semiconductor having a p-type electric conductivity, wherein: the barrier layers comprise: a first barrier layer disposed nearest to the n-type semiconductor layer among the barrier layers and formed of a GaN/AlGaN layer which has a layered structure of a GaN sublayer and a AlGaN sublayer, and second barrier layers disposed nearer to the p-type semiconductor layer than the first barrier layer and including an InGaN/GaN layer which has a layered structure of a InGaN sublayer and a GaN sublayer; and the well layers are each formed of an InGaN layer having a narrower band gap than that in the InGaN sublayer of the second barrier layers.

BRIEF DESCRIPTION OF DRAWINGS

FIG. 7A is a schematic conduction band diagram of a GaN-containing semiconductor light emitting device according to a fourth comparative example, while

DESCRIPTION OF EMBODIMENTS

First, described below is the first simulation which examined the current density dependence of the internal quantum efficiency (IQE) in the GaN-containing semiconductor light emitting device according to the first embodiment of the invention and the GaN-containing semiconductor light emitting device according to the first comparative example.

A GaN-containing semiconductor as referred to herein contains at least Ga and N. Addition of In, for example, to GaN to form InGaN works to narrow the band gap depending on the In fraction. Addition of Al, for example, to GaN to form AlGaN works to broaden the band gap depending on the Al fraction.

Figure 1:
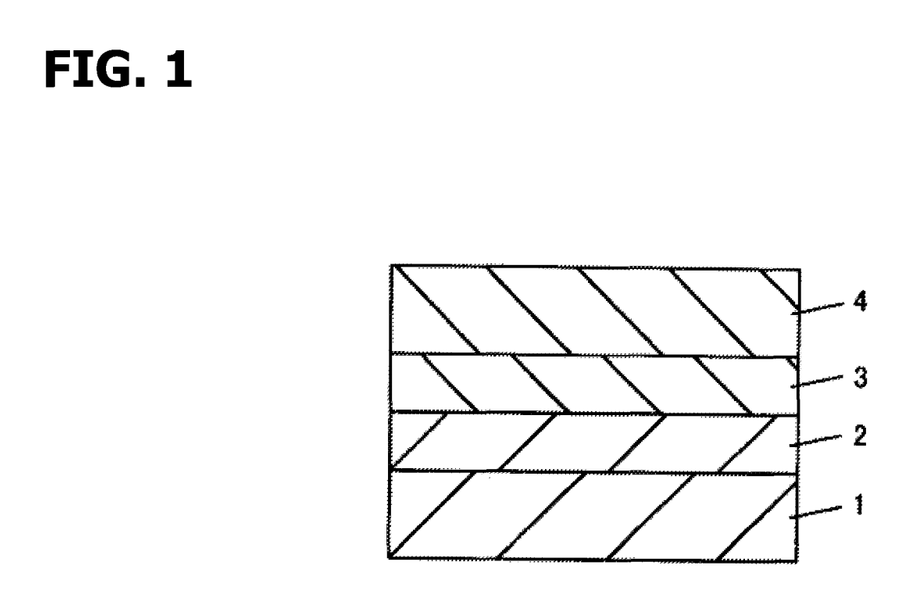
FIG. 1 is a schematic cross section view illustrating the structure of a light emitting device assumed in a first simulation.

FIG. 1 is a schematic cross section view of the structure of a light emitting device assumed in the first simulation. An active layer 2 with a multiple quantum well structure is formed on an n-type GaN layer 1 with a thickness of 5 μm, and a p-type clad layer (electron block layer) 3, which is a p-type $Al_{0.15}Ga_{0.85}N$ layer with a thickness of 20 nm, is formed on the active layer 2. Then, a p-type GaN layer 4 with a thickness of 80 nm is formed on the p-type clad layer 3. The GaN-containing semiconductor light emitting device according to the first embodiment and that according to the first comparative example have the same structural features except for the structure of their active layers 2.

Figure 2A:
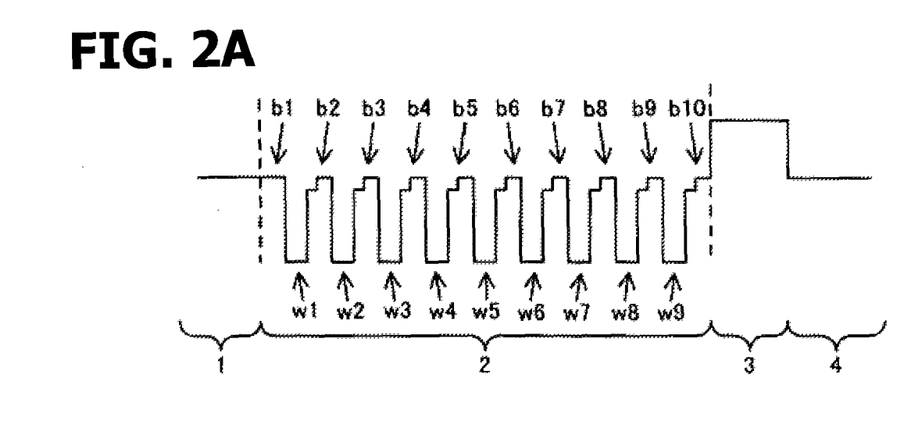
FIG. 2A and FIG. 2B are schematic conduction band diagrams of GaN-containing semiconductor light emitting devices according to a first comparative example and a first embodiment, respectively.
Figure 2B:
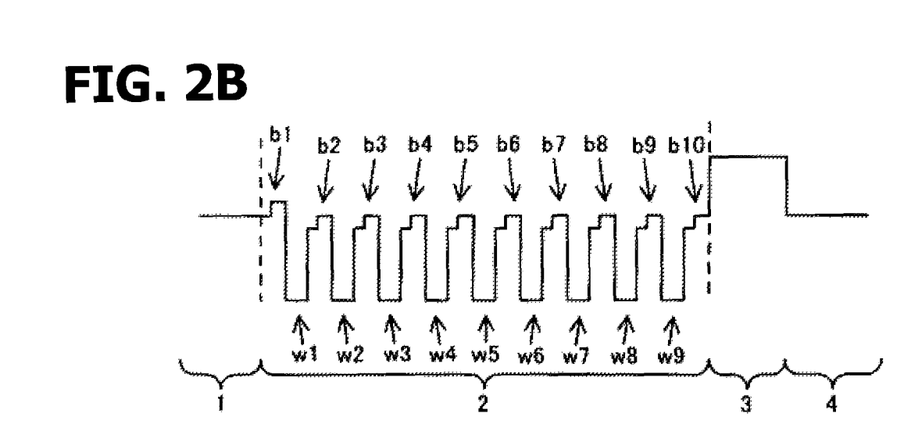

FIG. 2A and FIG. 2B are schematic conduction band diagrams of the GaN-containing semiconductor light emitting devices according the first comparative example and the first embodiment, respectively, which represent the layered structures of their active layers 2.

A barrier layer with a layered structure, such as one having a layered structure consisting of an InGaN sublayer and a GaN sublayer, is hereafter represented as InGaN/GaN layer or the like. The sublayer disposed nearer to the n-type semiconductor layer is given on the left-hand side of a slash (/).

In the active layers 2 according to the first comparative example and the first embodiment, ten barrier layers b1 to b10 and nine well layers w1 to w9 are stacked alternately. The barrier layer b1, which is disposed nearest to the n-type semiconductor layer, is referred to as the first barrier layer, while the barrier layer b10, which is disposed nearest to the p-type semiconductor layer, is referred to as the last barrier layer. The barrier layers b2 to b9, which are disposed in between, are referred to as internal barrier layers.

The active layer 2 according to the first comparative example may be as described below.

Barrier Layers
first barrier: GaN (with a thickness of 5 nm)
internal barriers: $In_{0.03}Ga_{0.97}N/GaN$ (with a thickness of 2 nm/3 nm)
last barrier: $In_{0.03}Ga_{0.97}N/GaN$ (with a thickness of 2 nm/3 nm)
number of barriers: 10

Well Layers
$In_{0.17}Ga_{0.83}N$ (with a thickness of 3.5 nm)
number of wells: 9

The active layer 2 according to the first embodiment may be as described below.

Barrier Layers
first barrier: $GaN/Al_{0.03}Ga_{0.97}N$ (with a thickness of 3 nm/2 nm)
internal barriers: $In_{0.03}Ga_{0.97}N/GaN$ (with a thickness of 2 nm/3 nm)
last barrier: $In_{0.03}Ga_{0.97}N/GaN$ (with a thickness of 2 nm/3 nm)
number of barriers: 10

Well Layers
$In_{0.17}Ga_{0.83}N$ (with a thickness of 3.5 nm)
number of wells: 9

Thus, the first barrier layer b1 is a GaN layer in the first comparative example while the first barrier layer b1 is a GaN/AlGaN layer in the first embodiment.

Here, the relationship of the In fraction x in the $In_xGa_{1-x}N$ material used in well layers to the In fraction y in the $In_yGa_{1-y}N$ material used in barrier layers is assumed so that the band gap is narrowed such as $0.10 \leq x \leq 0.25$ and $0.01 \leq y \leq 0.05$. For this simulation, it is assumed, for example, that x=0.17 and y=0.03.

SiLENSe, a band gap modeling simulation program supplied by STR, was used for simulation, and various parameters including strain, polarization, dislocation defects, and Auger effect were taken into consideration in making calculations. The electron mobility and the hole mobility were assumed to be 200 $cm^2/V \cdot s$ and 5 $cm^2/V \cdot s$, respectively.

Figure 3:
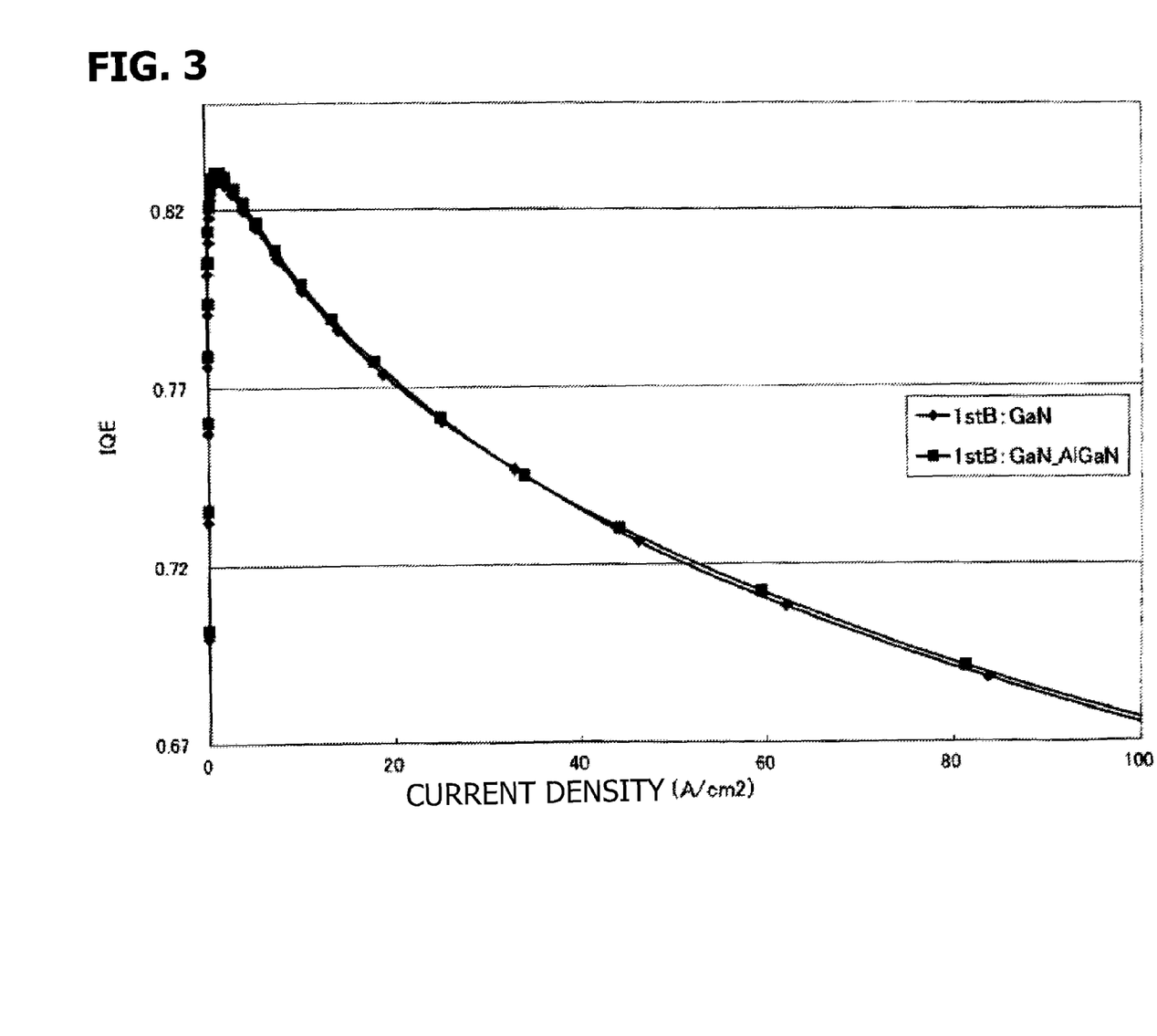
FIG. 3 is a graph obtained from the first simulation for the current density dependence of the IQE of the GaN-containing semiconductor light emitting devices according to the first embodiment and the first comparative example.

FIG. 3 is a graph obtained from the first simulation and illustrating the current density dependence of the IQE of the GaN-containing semiconductor light emitting devices according to the first embodiment and the first comparative example. Results for the first embodiment are plotted by squares while those for the first comparative example are plotted by rhombuses.

For both samples, the IQE rises rapidly as the current density increases from 0, and after reaching a maximum, it tends to decrease slowly as the current density further increases. For the first embodiment where the first barrier layer is a GaN/AlGaN layer, the IQE tends to be slightly higher almost over the entire range of current density examined as compared with the first comparative example where the first barrier layer is a GaN layer.

Factors in the higher IQE values for the first embodiment than for the first comparative example are discussed below. The following discussion, however, is intended only to propose an idea for interpretation of simulation results.

Figure 4:
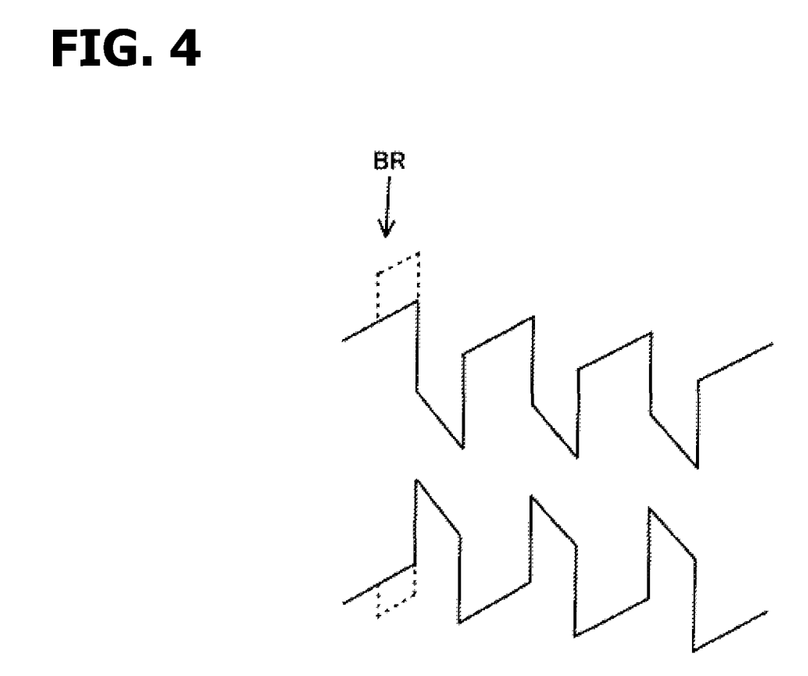
FIG. 4 gives a schematic conduction band diagram and a valence band diagram illustrating the effect of a GaN/AlGaN type first barrier layer in the active layer.

FIG. 4 gives a schematic conduction band diagram and a valence band diagram illustrating the effect of a GaN/AlGaN type first barrier layer in an active layer. The continuous and the broken lines illustrate band diagrams for cases where the first barrier layer BR is a GaN layer or a GaN/AlGaN layer, respectively.

The existence of an AlGaN sublayer in the first barrier layer BR works to broaden the band gap. The potential for electrons increased in the conduction band of the first barrier layer and the potential for holes increased in the valence band of the first barrier layer.

It is considered that this serves to improve the barrier properties of the first barrier layer against electrons, leading to a reduction in the number of electrons coming from the n-type semiconductor layer into the active layer. In an GaN-containing semiconductor device, the hole mobility is small as compared with the electron mobility, leading easily to a leak of electrons into the p-type semiconductor layer. It is inferred that a decrease in the number of electrons coming from the n-type semiconductor layer into the active layer is working to depress the leak of electrons into the p-type semiconductor layer, thereby improving the light emitting efficiency.

It is also inferred that improved barrier properties of the first barrier layer against holes act to decrease the number of holes that undergo nonradiative recombination after leaking from the active layer into the n-type semiconductor layer, resulting in improved light emitting efficiency.

It should be noted that the last barrier layer in the first embodiment has a InGaN/GaN type barrier layer structure to depress the increase in the potential for holes (enhancement of the barrier properties against holes). This prevents a reduction in the flow of holes coming from the p-type semiconductor layer into the active layer.

Figure 5:
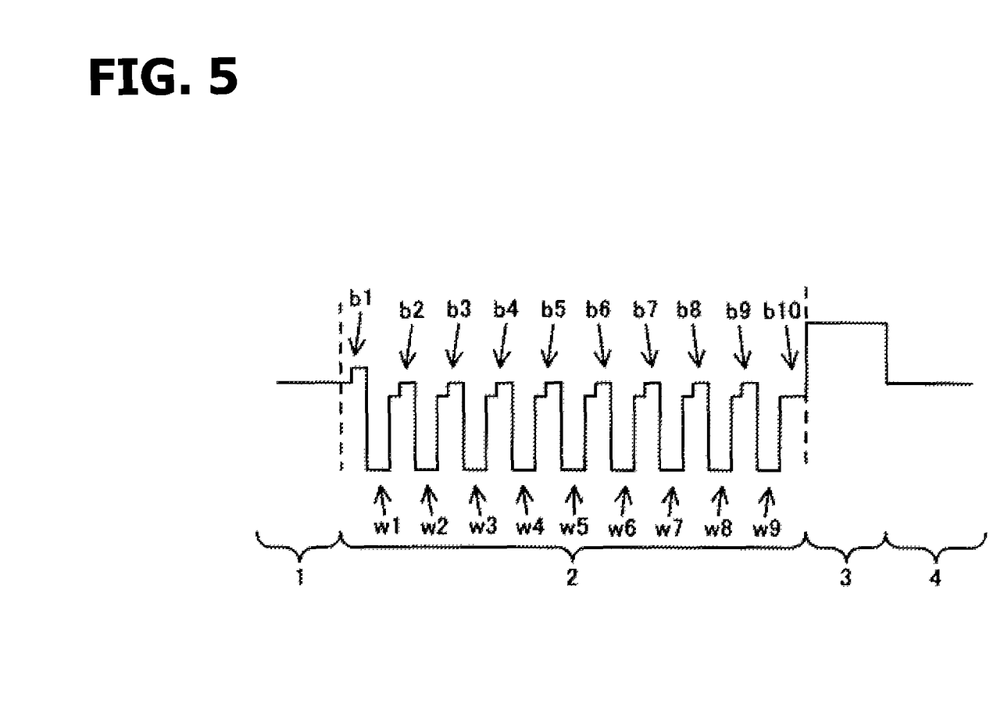
FIG. 5 is a schematic conduction band diagram of a GaN-containing semiconductor light emitting device according a modified form of the first embodiment.

FIG. 5 is a schematic conduction band diagram of a GaN-containing semiconductor light emitting device according a modified form of the first embodiment. As compared with the first embodiment, this differs in the structure of the active layer 2, and the last barrier layer b10 in this modified form is a InGaN layer (for example, an $In_{0.03}Ga_{0.97}N$ layer with a thickness of 5 nm).

The use of a last barrier layer b10 in the form of an InGaN instead of an InGaN/GaN layer works to narrow the band gap of the last barrier layer b10 and suppress the barrier properties against holes. This is expected to serve for accelerating the flow of holes coming from the p-type semiconductor layer into the active layer 2 to further improve the light emitting efficiency.

The above embodiment uses a barrier layer having a InGaN/GaN structure in which the InGaN sublayer faces the n-type semiconductor layer. Described below is the second simulation that examined the difference between GaN barrier layers and InGaN/GaN barrier layers used in the active layer of a multiple quantum well structure in a GaN-containing semiconductor light emitting device.

The second simulation focused on the GaN-containing semiconductor light emitting device according to the second comparative example, in which the active layer contains GaN barrier layers, and the GaN-containing semiconductor light emitting device according to the third comparative example, in which the active layer contains $In_{0.03}Ga_{0.97}N/GaN$ barrier layers. In both the second comparative example and the third comparative example, the well layers were formed of $In_{0.17}Ga_{0.83}N$. The conditions such as the thickness and number of the barrier layers and well layers are the same for the second comparative example and the third comparative example.

SiLENSe, a band gap modeling simulation program supplied by STR, was used for the simulation, and various parameters including strain, polarization, dislocation defects, and Auger effect were taken into consideration in making calculations.

Figure 6A:
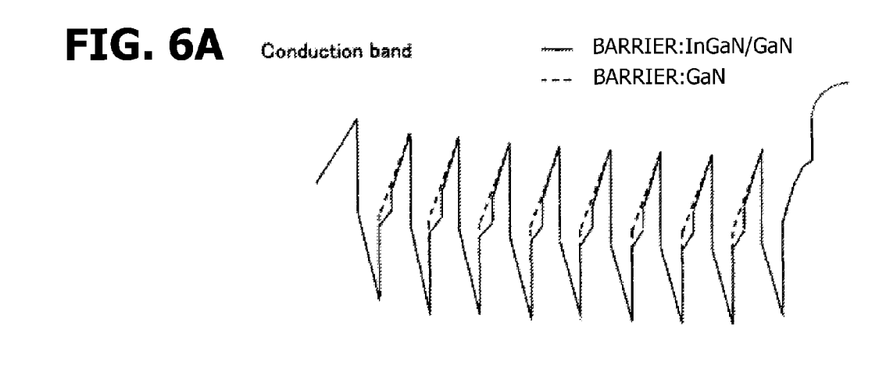
FIG. 6A and FIG. 6B are a conduction band diagram and a valence band diagram obtained from a second simulation for active layers of a second comparative example and a third comparative example, respectively.
Figure 6B:
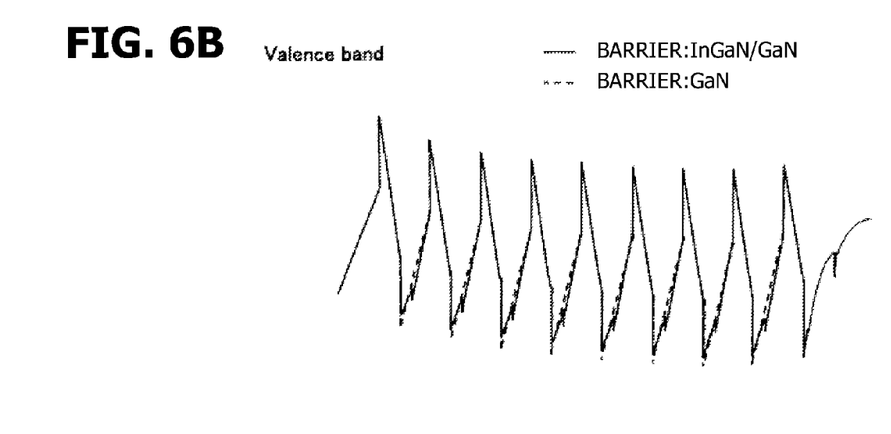

FIG. 6A and FIG. 6B are, respectively, a conduction band diagram and a valence band diagram obtained from the second simulation for the active layers in the second comparative example and the third comparative example. In the valence band diagram, it is seen that the peak in the potential for holes in the barrier layers is slightly lower for the third comparative example in which each barrier layer is formed of InGaN/GaN, as compared with the second comparative example in which each barrier layer is formed of GaN. It is expected accordingly that introduction of holes into the active layer, for instance, can be achieved more easily in the case of InGaN/GaN barrier layers rather than GaN barrier layers.

When analysis is carried out based only on schematic band diagrams (see FIG. 2A discussed above, for example), it seems that both GaN barrier layers and InGaN/GaN barrier layers give similar potential peaks in the GaN layer range. Results of the second simulation suggest, however, that InGaN/GaN barrier layers give a lower peak in the potential for holes in the valence band diagram than GaN barrier layers.

The above study results indicate that the light emitting efficiency of a GaN-containing semiconductor light emitting device with multiple quantum well structure can be improved by constructing the active layer so that the first barrier layer, which is disposed nearest to the n-type semiconductor layer, is formed of a GaN/AlGaN layer while the other barrier layers, which are disposed nearer to the p-type semiconductor layer than the first barrier layer, are each formed of an InGaN/GaN layer. A further improvement in light emitting efficiency can be expected if the last barrier layer, which is disposed nearest to the p-type semiconductor layer, is an InGaN layer.

Next, described below is the third simulation which examined the current density dependence of the internal quantum efficiency (IQE) in the GaN-containing semiconductor light emitting devices according to the second and the third embodiment and the GaN-containing semiconductor light emitting device according to the fourth comparative example.

Refer to FIG. 1 again. FIG. 1 is a schematic cross section view of the structure of a light emitting device assumed in the third simulation. An active layer 2 having a multiple quantum well structure is formed on an n-type GaN layer 1 with a thickness of 5 µm, and a p-type clad layer (electron block layer) 3, which is a p-type $Al_{0.15}Ga_{0.85}N$ layer with a thickness of 20 nm, is formed on the active layer 2. Then, a p-type GaN layer 4 with a thickness of 80 nm is formed on the p-type clad layer 3. The GaN-containing semiconductor light emitting devices according to the second and the third embodiment have the same structural features except for the structure of their active layers 2.

Figure 7A:
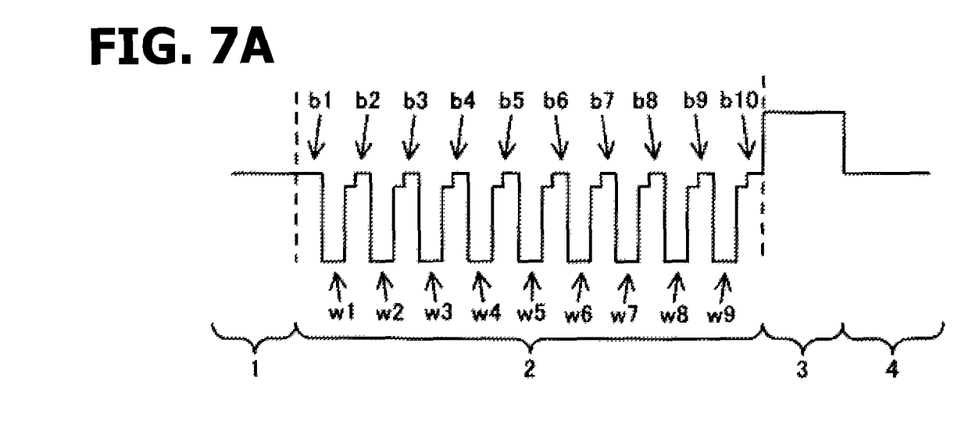
Figure 7B:
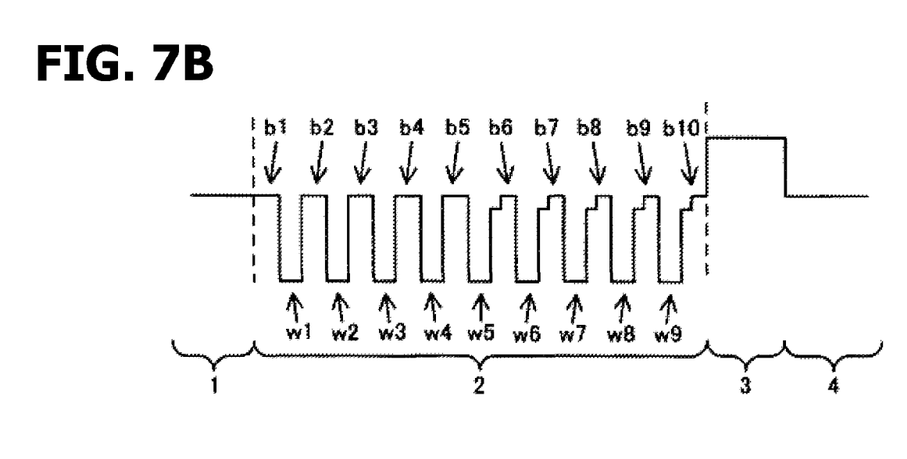
FIG. 7B and FIG. 7C are schematic conduction band diagrams of GaN-containing semiconductor light emitting devices according to a second embodiment and a third embodiment, respectively.
Figure 7C:
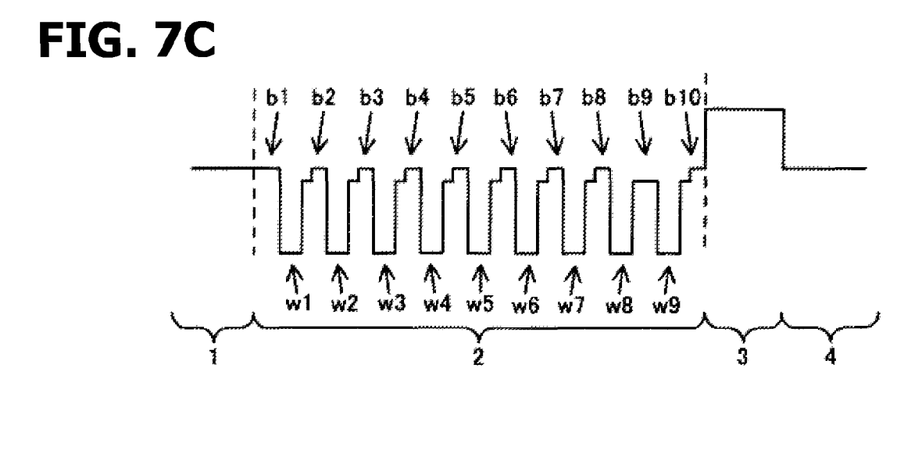

FIGS. 7A, 7B, and 7C are schematic conduction band diagrams of the GaN-containing semiconductor light emitting devices according the fourth comparative example, the second embodiment, and the third embodiment, respectively, which represent the layered structures of their active layers 2.

In the active layers 2 according to the fourth comparative example, the second embodiment, and the third embodiment, ten barrier layers b1 to b10 and nine well layers w1 to w9 are stacked alternately. The barrier layer b1, which is disposed nearest to the n-type semiconductor layer, is referred to as the first barrier layer, while the barrier layer b10, which is disposed nearest to the p-type semiconductor layer, is referred to as the last barrier layer. The barrier layers b2 to b9, which are disposed in between, are referred to as internal barrier layers.

The active layer 2 according to the fourth comparative example may be as described below.
Barrier Layers
first barrier: GaN (with a thickness of 5 nm)
internal barriers: $In_{0.03}Ga_{0.97}N$/GaN (with a thickness of 2 nm/3 nm)
last barrier: $In_{0.03}Ga_{0.97}N$/GaN (with a thickness of 2 nm/3 nm)
number of barriers: 10
Well Layers
$In_{0.17}Ga_{0.83}N$ (with a thickness of 3.5 nm)
number of wells: 9

The active layer 2 according to the second embodiment may be as described below.
Barrier Layers
first barrier: GaN (with a thickness of 5 nm)
internal barriers: GaN (with a thickness of 5 nm) in the four layers disposed nearer to the n-type semiconductor, and $In_{0.03}Ga_{0.97}N$/GaN (with a thickness of 2 nm/3 nm) in the other four layers disposed nearer to the p-type semiconductor layer
last barrier: $In_{0.03}Ga_{0.97}N$/GaN (with a thickness of 2 nm/3 nm)
number of barriers: 10
Well Layers
$In_{0.17}Ga_{0.83}N$ (with a thickness of 3.5 nm)
number of wells: 9

The active layer 2 according to the third embodiment may be as described below.
Barrier Layers
first barrier: GaN (with a thickness of 5 nm)
internal barriers: $In_{0.03}Ga_{0.97}N$/GaN (with a thickness of 2 nm/3 nm) in the seven layers disposed nearer to the n-type semiconductor, and $In_{0.03}Ga_{0.97}N$ (with a thickness of 5 nm) in the remaining layer disposed nearest to the p-type semiconductor layer
last barrier: $In_{0.03}Ga_{0.97}N$/GaN (with a thickness of 2 nm/3 nm)
number of barriers: 10
Well Layers
$In_{0.17}Ga_{0.83}N$ (with a thickness of 3.5 nm)
number of wells: 9

Thus, in the fourth comparative example, the eight internal barrier layers b2 to b9 are each formed of an InGaN/GaN layer, while in the second embodiment, the four, b2 to b5, of the eight internal barrier layers disposed nearer to the n-type semiconductor layer are each formed of a GaN layer and the other four layers b6 to b9 disposed nearer to the p-type semiconductor layer are each formed of an InGaN/GaN layer. In the third embodiment, the seven, b2 to b8, of the eight internal barrier layers disposed nearer to the n-type semiconductor layer are each formed of an InGaN/GaN layer and the remaining one, b9, disposed nearer to the p-type semiconductor layer is formed of an InGaN layer.

Here, the relationship of the In fraction x in the $In_xGa_{1-x}N$ material used in well layers to the In fraction y in the $In_yGa_{1-y}N$ material used in barrier layers is assumed so that the band gap is narrowed, such as $0.10 \leq x \leq 0.25$ and $0.01 \leq y \leq 0.05$. For this simulation, it is assumed, as an example, that x=0.17 and y=0.03.

SiLENSe, a band gap modeling simulation program supplied by STR, was used for the simulation, and various parameters including strain, polarization, dislocation defects, and Auger effect were taken into consideration in making calculations. The electron mobility and the hole mobility were assumed to be 200 cm$^2$/V·s and 5 cm$^2$/V·s, respectively.

Figure 8:
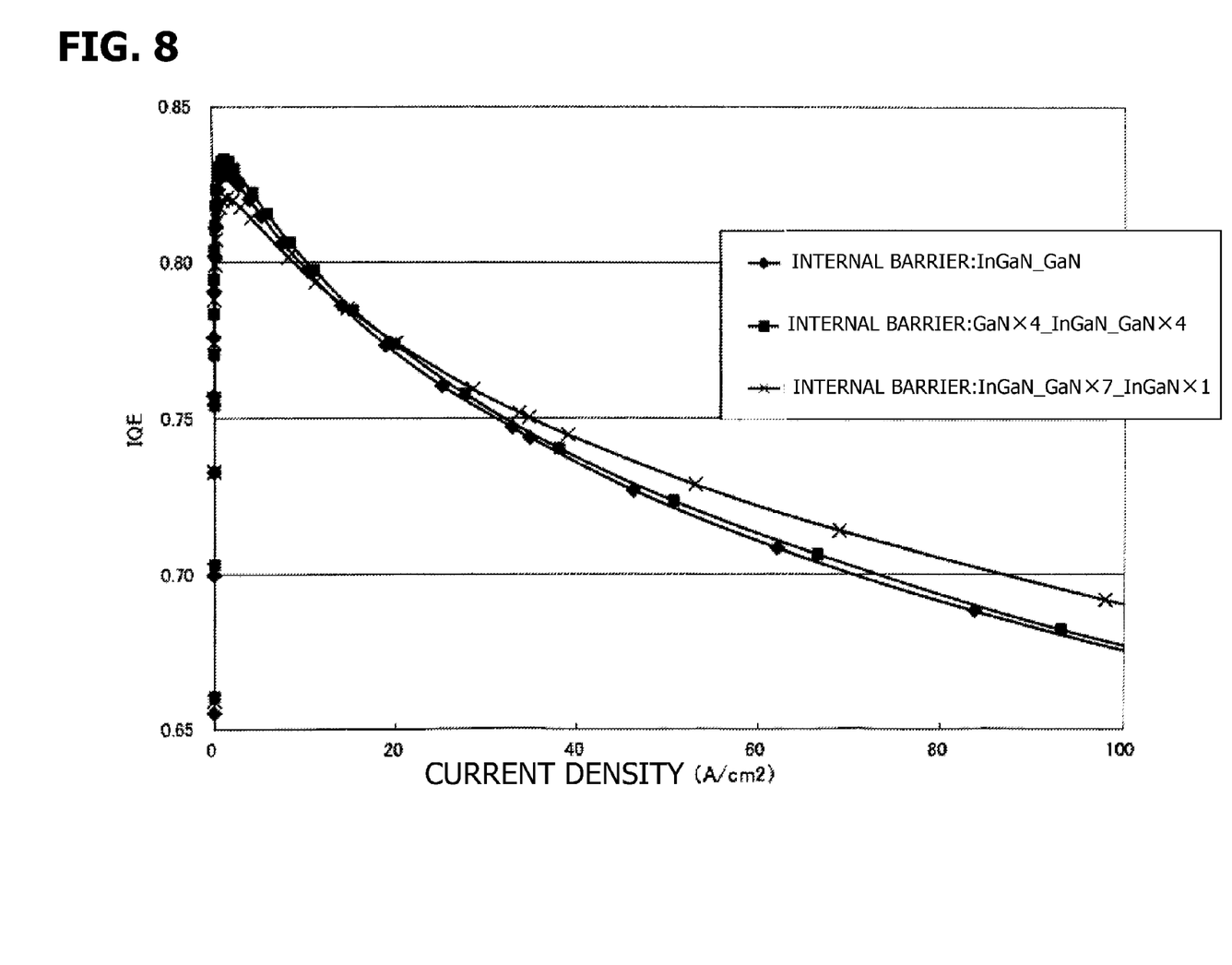
FIG. 8 is a graph obtained from a third simulation which examined the current density dependence of the IQE of the GaN-containing semiconductor light emitting devices according to the second embodiment, the third embodiment, and the fourth comparative example.

FIG. 8 is a graph obtained from the third simulation which examined the current density dependence of the IQE of the GaN-containing semiconductor light emitting devices according to the second embodiment, the third embodiment, and the fourth comparative example. Results for the second and the third embodiment are plotted by squares and crosses, respectively, while those for the fourth comparative example are plotted by rhombuses.

For all samples, the IQE rises rapidly as the current density increases from 0, and after reaching a maximum, it tends to decrease slowly as the current density further increases.

For the second embodiment, the IQE tends to be slightly higher almost over the entire range of current density examined as compared with the fourth comparative example.

As compared with the fourth comparative example, the IQE for the third embodiment is slightly higher in the tail-off range (above about 15 A/cm$^2$) though the maximum is lower. Even when compared with the second embodiment, a higher IQE is seen for the third embodiment in the tail-off range (above about 20 A/cm$^2$) where the IQE decreases slowly with an increasing current density.

For all samples prepared according to the second embodiment, the third embodiment, and the fourth comparative example, the IQE is found to decrease with an increasing current density after reaching a maximum (droop phenomenon), but for the third embodiment, in particular, the rate of IQE decrease with an increasing current density is smaller, indicating relaxation of the droop phenomenon, as compared with the fourth comparative example and the second embodiment.

The GaN-containing semiconductor light emitting devices according to the embodiments practically assume, for instance, 1 mm×1 mm light emitting diodes (LEDs) that are driven by a current of 350 mA (current density 35 A/cm$^2$). From the viewpoint of current density range, they are assumed to be used at about 30 A/cm$^2$ or more. In such a high current density range, a higher IQE can be achieved in the third embodiment than in the fourth comparative example.

Thus, the light emitting devices according to the second embodiment and the third embodiment can achieve an improved IQE as compared with the fourth comparative example. Next, discussed below are factors in the improvement in IQE that took place in the light emitting devices according to the second embodiment and the third embodiment. The following discussion, however, is intended only to propose an idea for interpretation of the simulation results.

The portion of the active layer 2 extending from its through-thickness center to the n-type semiconductor layer and the remaining portion extending from its through-thickness center to the p-type semiconductor layer are hereafter referred to as the n-type semiconductor layer-side portion of the active layer 2 and the p-type semiconductor layer-side portion of the active layer 2, respectively. In the active layers 2 in the second embodiment, the third embodiment, and the fourth comparative example, the barrier layers b1 to b5 belong to the n-type semiconductor layer-side portion while the barrier layers b6 to b10 belong to the p-type semiconductor layer-side portion.

First, factors in the higher IQE values seen for the second embodiment than in the fourth comparative example is discussed below. As described above, the second simulation suggests that the peak in the potential for holes in the valence band is lower and the barrier properties against holes are lower in an InGaN/GaN type barrier layer than in a GaN type barrier layer.

All the internal barrier layers b2 to b9 are formed of InGaN/GaN layers in the fourth comparative example, while the four internal barrier layers b2 to b5 in the n-type semiconductor layer-side portion are each formed of a GaN layer in the second embodiment.

This indicates that the second embodiment has a structural feature that the peak in the potential for holes (barrier properties against holes) in the valence band is higher in the n-type semiconductor layer-side portion of the active layer 2 than in its p-type semiconductor layer-side portion. Accordingly, it can be said that the rise in the peak in the potential for holes (barrier properties against holes) in the valence band is depressed in the p-type semiconductor layer-side portion of the active layer 2 than in its n-type semiconductor layer-side portion.

It is inferred therefore that in the second embodiment, the reduction in the flow of holes coming from the p-type semiconductor layer into the active layer 2 is depressed and at the same time the number of holes undergoing nonradiative recombination after leaking into the n-type semiconductor layer is decreased, leading to an improved light emitting efficiency.

Figure 9A:
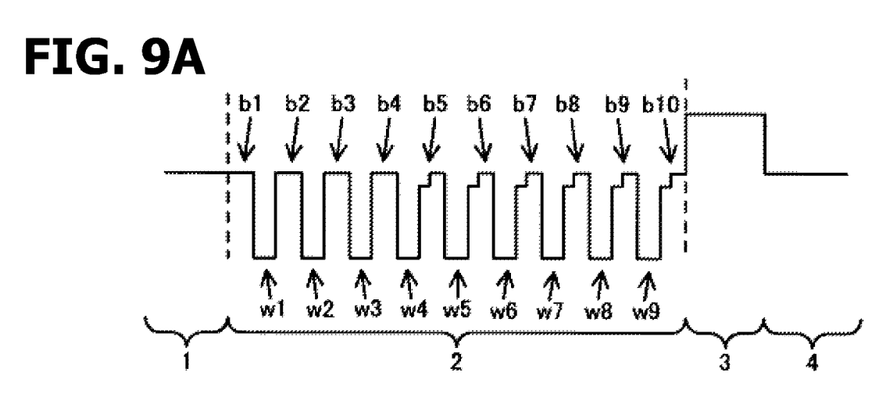
FIG. 9A and FIG. 9B are schematic conduction band diagrams of GaN-containing semiconductor light emitting devices according a modified form of the second embodiment and a modified form of the third embodiment, respectively.

All the internal barrier layers (b2 to b5) in the n-type semiconductor layer-side portion are each formed of a GaN layer in the barrier layer stack structure according to the second embodiment given in FIG. 7B, but it should be noted that a similar effect will be achieved in a barrier layer stack structure in which only some of the internal barrier layers in the n-type semiconductor layer-side portion are each formed of a GaN layer as assumed in the modified form of the second embodiment illustrated in FIG. 9A.

Thus, the above effect will be achieved in the case where the n-type semiconductor layer-side portion of the active layer (active layer 2) is structured so that the barrier layer (b1) disposed nearest to the n-type semiconductor layer is formed of a GaN layer while the second and subsequent barrier layer (b2 to b5) from the n-type semiconductor layer are each formed of a GaN layer or are a mixture of GaN barrier layer or layers and InGaN/GaN barrier layer or layers and at the same time where the barrier layers (b6 to b10) in the p-type semiconductor layer-side portion are each formed of an InGaN/GaN layer.

Next, factors in the higher IQE values in the third embodiment than in the fourth comparative example are discussed below. The internal barrier layers b2 to b9 are each formed of an InGaN/GaN layer in the fourth comparative example, while the internal barrier layer b9 disposed nearest to the p-type semiconductor layer (which is the second barrier layer from the p-type semiconductor layer) is formed of an InGaN layer in the third embodiment.

In an InGaN barrier layer, which has a narrower band gap than a GaN layer, the peak in the potential for holes in the valence band is lower (and the peak in the potential for electrons in the conduction band is also lower) than in an InGaN/GaN barrier layer and in a GaN barrier layer.

In the third embodiment, it is considered that since the second barrier layer b9 from the p-type semiconductor layer has lower barrier properties against holes, the flow of holes into the second well layer w8 from the p-type semiconductor layer increases while the hole density in the well w9 disposed nearest to the p-type semiconductor layer decreases. This is expected to cause relaxation of the Auger effect, thereby improving the light emitting efficiency.

Figure 9B:
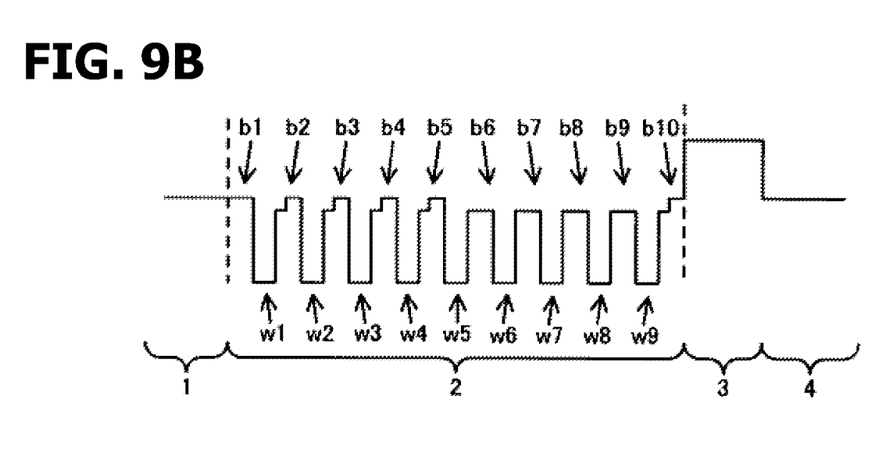

Some of the internal barrier layers in the p-type semiconductor layer-side portion, such as the internal barrier layer b9 disposed nearest to the p-type semiconductor layer, are each formed of an InGaN layer in the barrier layer stack structure according to the third embodiment given in FIG. 7C, but it should be noted that a similar effect will be achieved in a barrier layer stack structure in which the internal barrier layers (b6 to b9) in the p-type semiconductor layer-side portion are each formed of an InGaN layer as assumed in the modified form of the third embodiment illustrated in FIG. 9B.

Thus, the above effect will be achieved in the case where the p-type semiconductor layer-side portion of the active layer (active layer 2) is structured so that the barrier layer (b10) disposed nearest to the p-type semiconductor layer is formed of an InGaN/GaN layer while the second and subsequent barrier layers (b9 to b6) from the p-type semiconductor layer are each formed of an InGaN layer or are a mixture of InGaN barrier layer or layers and InGaN/GaN barrier layer or layers and at the same time where the n-type semiconductor layer-side portion is structured so that the barrier layer (b1) disposed nearest to the n-type semiconductor layer is formed of a GaN layer while the second and subsequent barrier layers (b2 to b5) from the n-type semiconductor layer are each formed of an InGaN/GaN layer.

The second embodiment and the third embodiment in combination suggest that the improvement in light emitting efficiency can be attributed to the structure in which the peak in the potential for holes in the valence band is lower in the barrier layers in the p-type semiconductor layer-side portion of the active layer 2 as compared to the barrier layers in the n-type semiconductor layer-side portion.

An even number of barrier layers are assumed in the above embodiments. In cases where an odd number of barrier layers exist and a barrier layer is located at the through-thickness center, the barrier layer located at the through-thickness center can be assumed to be included either in the p-type semiconductor layer-side portion or in the n-type semiconductor layer-side portion, and it is assumed here that such a layer is included in the p-type semiconductor layer-side portion.

Figure 10:
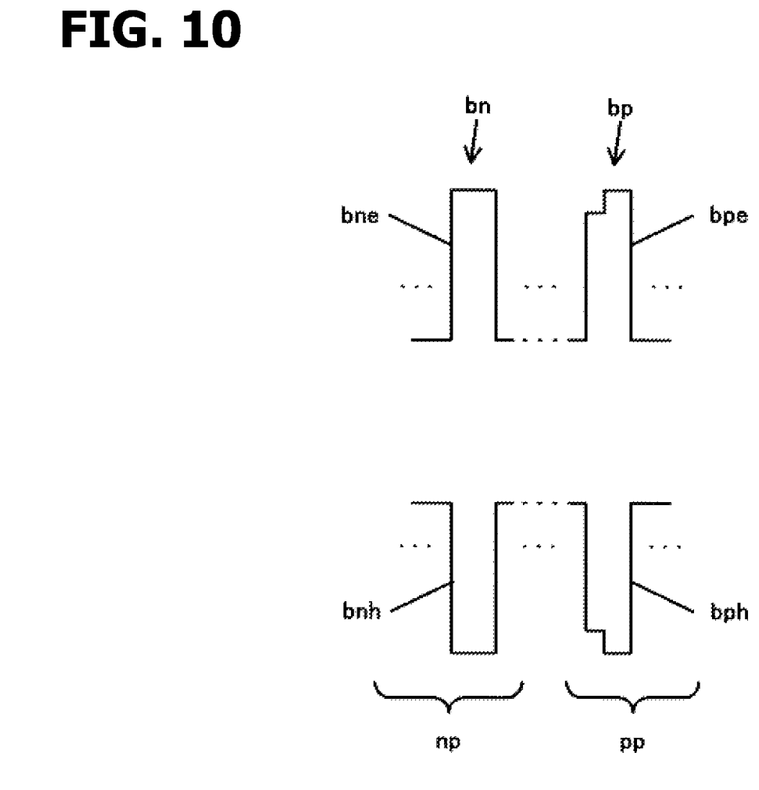
FIG. 10 is a schematic band diagram of an active layer of an embodiment.

FIG. 10 illustrates a schematic band diagram of an active layer of an embodiment. The upper portion and the lower portion illustrate the conduction band and the valence band, respectively. A GaN barrier layer bn and an InGaN/GaN barrier layer by are illustrated as representative examples of barrier layer respectively in the n-type semiconductor layer-side portion np and the p-type semiconductor layer-side portion pp.

The GaN barrier layer bn forms a potential barrier bne for electrons and a potential barrier bnh for holes respectively in the conduction band and in the valence band. The InGaN/GaN barrier layer by forms a potential barrier bpe for electrons and a potential barrier bph for holes respectively in the conduction band and in the valence band.

As described above, it is expected that the light emitting efficiency of a GaN-containing semiconductor light emitting device with a multiple quantum well structure can be improved by decreasing the peak in the potential for holes in the valence band in the p-type semiconductor layer-side portion of the active layer as compared to that in the n-type semiconductor layer-side portion.

Thus, the present invention has been described above based on embodiments thereof, but the invention should not be construed as being limited thereto. For instance, various modifications, alterations, and combinations will become apparent to those skilled in the art.

What is claimed is:

1. A GaN-containing semiconductor light emitting device comprising:
   an n-type semiconductor layer formed of GaN-containing semiconductor having an n-type electric conductivity;
   an active layer formed on the n-type semiconductor layer, the active layer being formed of GaN-containing semiconductor and having a multiple quantum well structure including a plurality of barrier layers and well layers stacked alternately; and
   a p-type semiconductor layer formed on the active layer and being formed of GaN-containing semiconductor having a p-type electric conductivity;
   wherein the barrier layers comprise:
      a first barrier layer disposed nearest to the n-type semiconductor layer among the barrier layers and being formed of a GaN/AlGaN layer which has a layered structure of a GaN sublayer and an AlGaN sublayer; and
      second barrier layers disposed nearer to the p-type semiconductor layer than the first barrier layer and including an InGaN/GaN layer which has a layered structure of an InGaN sublayer and a GaN sublayer; and
   wherein the well layers are each formed of an InGaN layer having a narrower band gap than that of the InGaN sublayer of the second barrier layers.

2. The GaN-containing semiconductor light emitting device as claimed in claim 1, wherein the second barrier layers comprise a third barrier layer disposed nearest to the p-type semiconductor layer among the second barrier layers and being formed of an InGaN layer.

* * * * *

UNITED STATES PATENT AND TRADEMARK OFFICE
CERTIFICATE OF CORRECTION

PATENT NO. : 8,816,320 B2  Page 1 of 1
APPLICATION NO. : 13/743961
DATED : August 26, 2014
INVENTOR(S) : Sho Iwayama et al.

It is certified that error appears in the above-identified patent and that said Letters Patent is hereby corrected as shown below:

On the Title Page, Item (54) and in the Specification, Column 1, line 1, Title:
delete "GAN-CONTAINING" and insert --GaN-CONTAINING--.

Signed and Sealed this
Twenty-sixth Day of April, 2016

Michelle K. Lee
*Director of the United States Patent and Trademark Office*